US009362602B2

(12) United States Patent
Darwish et al.

(10) Patent No.: US 9,362,602 B2
(45) Date of Patent: Jun. 7, 2016

(54) POWER DIVIDING AND/OR POWER-COMBINING CIRCUITS WITH ISOLATION

(71) Applicant: U.S. Army Research Laboratory ATTN: RDRL-LOC-I, Adelphi, MD (US)

(72) Inventors: Ali M. Darwish, Overland Park, KS (US); Hingloi Alfred Hung, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 84 days.

(21) Appl. No.: 14/487,821

(22) Filed: Sep. 16, 2014

(65) Prior Publication Data

US 2015/0002243 A1 Jan. 1, 2015

Related U.S. Application Data

(63) Continuation-in-part of application No. 13/922,980, filed on Jun. 20, 2013, now Pat. No. 9,000,865.

(60) Provisional application No. 61/835,688, filed on Jun. 17, 2013.

(51) Int. Cl.
| | |
|---|---|
| *H01P 5/12* | (2006.01) |
| *H03F 3/68* | (2006.01) |
| *H01P 1/18* | (2006.01) |
| *H01P 9/00* | (2006.01) |
| *H03H 7/42* | (2006.01) |
| *H03H 7/18* | (2006.01) |
| *H03F 3/189* | (2006.01) |
| *H03F 3/21* | (2006.01) |
| *H03F 3/60* | (2006.01) |

(52) U.S. Cl.
CPC ............... *H01P 1/182* (2013.01); *H01P 1/184* (2013.01); *H01P 9/00* (2013.01); *H03F 3/189* (2013.01); *H03F 3/211* (2013.01); *H03F 3/602* (2013.01); *H03F 3/68* (2013.01); *H03H 7/185* (2013.01); *H03H 7/422* (2013.01)

(58) Field of Classification Search
CPC .......... H01P 1/182; H01P 1/184; H01P 9/00; H03H 7/422; H03H 7/185; H03F 3/189; H03F 3/68; H03F 3/211; H03F 3/602
USPC ....................................................... 333/136
See application file for complete search history.

(56) References Cited

U.S. PATENT DOCUMENTS

| | | | | |
|---|---|---|---|---|
| 2,877,427 | A | | 3/1959 | Butler |
| 3,953,702 | A | * | 4/1976 | Bickel .................... H03B 7/146 219/748 |
| 5,070,304 | A | * | 12/1991 | Salib ...................... H03F 3/607 330/124 R |

*Primary Examiner* — Robert Pascal
*Assistant Examiner* — Kimberly Glenn
(74) *Attorney, Agent, or Firm* — Eric Brett Compton

(57) ABSTRACT

Power-dividing and/or power-combining circuits have inputs, outputs, and at least three electrical pathways, with substantially equal input and output reflection coefficients. An electronic device may be provided in each of the pathways. Additionally, isolation circuits or devices can be inserted between signal lines to provide isolation between inputs, in the case of combining, or outputs, in the case of dividing. In one embodiment, multiple phase shift components are electrically connected to electronic devices in the electrical pathways. These phase shift components are selected so that a vector sum of the reflected signals from the inputs in combining and/or to the outputs in dividing is substantially minimized.

20 Claims, 8 Drawing Sheets

POWER DIVIDING AND/OR POWER-COMBINING CIRCUITS WITH ISOLATION

CROSS REFERENCE TO RELATED APPLICATION(S)

The present application is a continuation-in-part (CIP) application of U.S. patent application Ser. No. 13/922,980 filed on Jun. 20, 2013, which claims the benefit of U.S. Provisional Patent Application No. 61/835,688 filed on Jun. 17, 2013, both applications herein incorporated by reference in their entirety for all purposes.

GOVERNMENT INTEREST

The invention described herein may be manufactured, used, and licensed by or for the United States Government without the payment of royalties thereon.

BACKGROUND OF THE INVENTION

I. Field of the Invention

The present invention relates generally to electronic circuits and, more particularly, to power-dividing and/or power-combining circuits.

II. Description of Related Art

Millimeter wave communication, radar, electronic warfare systems, also known as microwave systems, conventionally use amplifiers to increase the power output signal level. An increase in the output power for the microwave system achieves many advantages, e.g. improved operating range, improved communications, and the like.

In order to amplify the microwave transmission signal, conventionally the signal is divided by a splitter having one input and two outputs so that one output signal is coupled as an input signal to one amplifier while the other output signal is connected as an input signal to the other amplifier. The outputs from the amplifiers are then connected to a combiner so that the output signal from the combiner is equal to the input signal amplified by the two amplifiers minus any losses in the splitter or combiner.

Furthermore, the splitter, also known as a divider, is identical to a combiner, but used in the reverse direction. For example, a splitter or divider would have one input and two outputs while the combiner has two inputs and one output so that the divider component is a mirror image of the combiner component. For that reason, the term "combiner/divider" is used interchangeably since a divider may be used either as a divider or a combiner depending upon the fashion in which it is connected to the amplifier circuit.

In order to achieve efficient power amplifier designs for microwave communications, it is critical that the path length from the outputs of the splitter and to the inputs of the combiner be equal. Otherwise, the signals from the amplifiers do not add constructively and power is lost. Likewise, it is necessary that the phase shift, if any, from the outputs of the splitter and to the inputs of the combiner be the same for each amplifier in order for the power output signals from the amplifiers to add or combine constructively.

One inherent problem with power signal level amplification in microwave systems is that the power amplifiers located between the divider and the combiner each exhibits an input reflection coefficient so that a portion of the signal provided by the divider to the power amplifier is reflected back to the input of the power amplifier circuit. This reflected signal effectively reduces the overall power input to the power amplifiers. This, in turn, reduces the overall efficiency of the power amplifier.

In order to reduce the adverse effects of the reflected power from the power amplifiers, there have been previously known balanced microwave power amplifier circuits which eliminated, or at least greatly reduced, the adverse effect of reflected power from the power amplifiers. These previously known balanced amplifier circuits included a first phase delay of 90° in between the divider output and the first amplifier while the output from the first amplifier was connected as an input signal to the combiner. Conversely, the input of a second amplifier was connected directly to a second output from the divider while the output from the second amplifier was electrically connected through a 90° phase shift delay line to a second input of the combiner. In operation, and assuming that both amplifiers are identical in operation to each other, a reflected signal from the first amplifier exhibits a phase shift of 180° at the output from the divider since the signal ultimately resulting in the reflected signal passes through the 90° delay line twice. Conversely, the phase of the reflection from the second amplifier back to the divider exhibits 0° phase shift, relative to the one reflected from the first amplifier. Since the magnitudes of the reflected signals from both amplifiers are equal, the reflected signals from the two amplifiers cancel each other.

These previously known balanced combiner microwave power amplifier circuits, however, have been limited to a two amplifier configuration between the divider and the combiner. In many situations, however, a simple two amplifier circuit produces insufficient output power for the microwave system.

In some circumstances, it may be possible to cascade two or more balanced power amplifier circuits together to increase the overall power output of the microwave system. However, the addition of extra divider/combiner pairs, each having a pair of power amplifiers electrically connected there between, increases the overall size and bulk of the microwave power system. In many situations, such as monolithic microwave/millimeter wave integrated circuits (MMICs), the cascading of multiple balanced pairs of amplifiers is simply impractical due to the limited space available on the MMIC substrate.

SUMMARY OF THE PRESENT INVENTION

The present invention provides power-dividing and/or power-combining circuits that overcome all of the above-mentioned disadvantages of the previously-known power amplifier circuits or other similar circuits.

In one embodiment, a power-dividing and/or power-combining circuit may include: one or more inputs, one or more outputs, at least three electrical pathways, with substantially equal signal reflection between the one or more inputs and the one or more outputs. Additionally, isolation circuits or devices can be inserted between pairs of signal lines to provide isolation between various inputs or outputs.

Depending on the particular circuit application, the one or more isolation circuits or devices may comprise a resistor, inductor, capacitor, transistor, transmission line, or any combination thereof, or electromagnetic absorbing material. The one or more isolation circuits or devices may be selected to be on the order of magnitude of the characteristic impedance of a system connected to the circuit. Where resistors are used, they may range from about 0 to 1,000 ohms. At least one isolation circuit or device may be positioned between two pathways, with one pathway going to one input or output and the other pathways going to another input or output. The two pathways can be parallel to one another, for example. The one or more isolation circuits or devices may be positioned at approximately 180/N degrees integrals of electric length of a pathway.

In some embodiments, at least one electronic device is provided in each of the electrical pathways. A plurality of phase shift components are further provided with at least one phase shift component electrically connected in series with the electronic devices in each of the electrical pathways. The phase shift components are selected so that a vector sum of the reflected signals from the electronic devices to the one or more inputs and/or the one or more outputs is substantially minimized.

Circuits according this embodiment may be configured as: (i) a divider having one input and a plurality of outputs, and a splitter generating inputs to the pathways from the one input, with outputs from the pathways providing the plurality of outputs; (ii) a combiner having a plurality of inputs and one output, and an adder generating the one output from outputs from the pathways, with inputs to the pathways providing the plurality of inputs; or (iii) a divider/combiner having one input and one output, a splitter generating inputs to the pathways from the one input, and an adder generating the one output from outputs from the pathways. When configured as (iii) a power divider/combiner the total signal phase shift between the multiple paths as measured between the one input and the one output is substantially equal to zero.

Depending on the particular circuit application, the electronic devices may include amplifiers, switches, attenuators, mixers, filters, antenna elements (e.g., phased-array elements), etc. For example, in a three amplifier system embodiment, the input of one amplifier is connected directly to the output from the divider while a phase shift component equal to 120° is electrically connected in series from the output of the first amplifier and to a first input of the combiner. For the second amplifier, a 60° phase shift component is electrically connected in between both the input to the second amplifier and the output from the divider as well as between the output from the second amplifier and a second input to the combiner. Lastly, a phase shift component of 120° is electrically connected between the third output from the divider and the input of the third amplifier while the output from the third amplifier is connected, with no additional phase delay, as an input signal to the third input of the combiner.

In the operation of the three amplifier system, and assuming ideal operation of the amplifiers and also that the amplifiers are identical in operation to each other, a portion of the input signal is reflected by the first amplifier back to the input which is in phase with the incoming signal. Conversely, the reflected signal from the second amplifier at the input is equal in magnitude, but offset 120° from the reflected signal from the first amplifier. Similarly, the third amplifier reflects a signal equal in amplitude to the reflected signals of both the first and second amplifiers, but with a phase shift of 240°.

Since the reflected signals from the amplifiers at the input to the power amplifier circuit are equal in amplitude, but angularly offset from each other by 120°, these three reflected vector signals, when combined, cancel and thus eliminate, or at least minimize, signal loss at the input to the power amplifier circuit.

For circuits containing four or more electronic devices, the actual selection of the delay component will differ in order to produce a reflected signal at the input which vectorally cancels thus resulting in zero or at least low signal loss.

In another embodiment, a power-dividing and/or power-combining circuit may include: one or more inputs, one or more outputs, at least three electrical pathways, at least three electronic devices with substantially equal signal reflection between the one or more inputs and the one or more outputs, and one or more isolation circuits or devices positioned between at least one input or at least one output and at least one pathway. At least one electronic device is provided in each of the electrical pathways. A serial bus extends from the one or more input and the one or more outputs, the serial bus having serially connected impedance-providing components, positioned between the electrical pathways, the impedance-providing components increasing in impedance from one end and to the other end of the serial bus in an amount sufficient to produce a substantially equal amount of power to each of at least three electronic devices.

Circuits according this embodiment may be configured as: (i) a divider having one input and a plurality of outputs, wherein the serial bus generates inputs to the pathways from the one input, with outputs from the pathways providing the plurality of outputs; (ii) a combiner having a plurality of inputs and one output, wherein the serial bus generates the one output from outputs of the pathways, with inputs to the pathways providing the plurality of the inputs; or (iii) a divider/combiner having one input and one output, wherein a first of the serial bus generates inputs to the multiple pathways from the one input, and a second of the serial bus generates the one output from outputs from the multiple paths. When configured as (iii) the combiner/divider, the total signal phase shift between the multiple paths as measured at the one input and the one output is substantially equal to zero.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION

In general, the power-dividing and/or power-combining circuits described herein have inputs, outputs, at least three electrical pathways. At least one electronic device may be provided in each of the electrical pathways. Depending on the configuration of the inputs, outputs, the pathways and the electronic devices may be connected in parallel between the inputs and outputs. The electronic devices have substantially equal signal reflection at the inputs and/or the outputs. For example, the electronic devices may have input reflection coefficients and substantially equal output reflection coefficients. While the embodiments illustrated in the figures generally show a power amplifier as an electronic device, it should be appreciated that the circuits may include other electronic devices as well. For instance, the electronic devices may include amplifiers, switches, attenuators, mixers, filters, antenna elements (e.g., phased-array elements), etc. A power-dividing and/or power-combining circuit may include a power-divider or power-combiner with or without electronic devices present.

Figure 1:
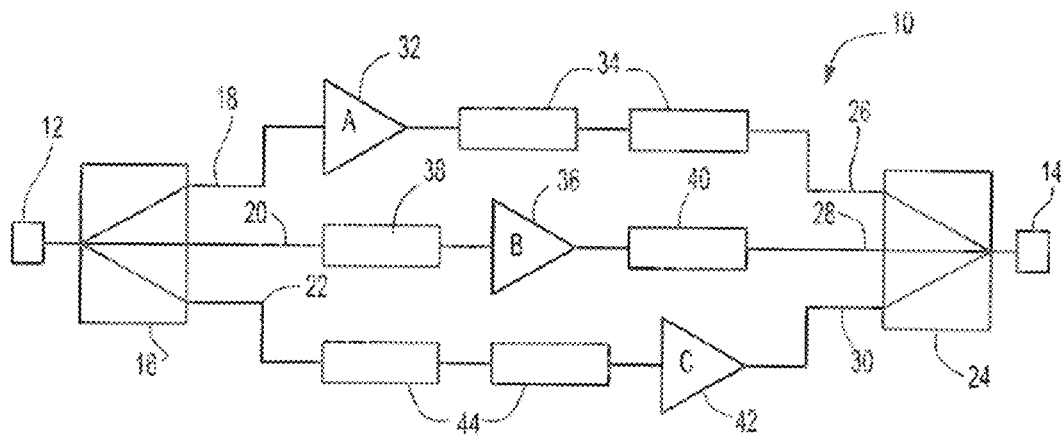
FIG. 1 is a block diagrammatic view of a circuit containing three power amplifiers and multiple phase shift components connected in series with each of the electronic devices according to an embodiment.

FIG. 1 is a block diagrammatic view of a circuit containing three power amplifiers and multiple phase shift components connected in series with each of the electronic devices according to an embodiment. As will be appreciated, multiple phase shift components are provided with at least one phase shift component electrically connected in series with the electronic devices in each of the electrical pathways. The phase shift components are selected so that a vector sum of the reflected signals from the electronic devices to the one or more inputs and/or the one or more outputs is substantially minimized.

With reference first to FIG. 1, a millimeter wave, e.g. 32 gigahertz, power amplifier circuit 10 is illustrated. It should be appreciated that the amplifier circuit 10 may be used for other frequency bands and applications. The circuit 10 may be configured for operation in the frequency range 0.1-1,000 GHz, in some instances. Here, the circuit 10 is configured as both a power-divider and a power-combiner. More particularly, the power amplifier circuit 10 includes both a power input 12 as well as a power output 14 with multiple electrical pathways (e.g., three as illustrated) provided between the power input 12 and the power output 14 including respective electronic devices. The entire power amplifier circuit 10 may be implemented as an MMIC in some embodiments.

The power-dividing portion of the circuit 10 includes the power input 12 connected to a signal splitter 16 which splits an input signal to input 12 into three inputs 18, 20, and 22 to the multiple pathways including the electronic devices, such as amplifiers 32, 36, and 42. Ideally, the splitter 16 evenly divides the input signal to the power input 12 so that the power signal levels at each of inputs 18, 20, and 22 to the multiple pathways are not only equal in magnitude, but also equal in phase to each other. If inputs 18, 20, and 22 are separately desired or provided for in the circuit, a splitter element dividing an input signal into multiple signals may not be needed. Ideally, the signal splitter 16 exhibits a constant phase shift of the signals between power input 12 and the inputs 18, 20 and 22 to the multiple pathways and, likewise, introduces negligible signal loss for the circuit 10.

Similarly, the power-combining portion of the circuit 10, has a signal adder 24 which receives signals from three outputs 26, 28, and 30 of the multiple pathways and combines them into single signal for output at the power output 14. If separate outputs are desired or provided for in the circuit, an adder element combining the outputs 26, 28, and 30 into one output signal may not be needed.

Ideally, the signal adder 24 exhibits a constant phase shift of the signals between outputs 26, 28, and 30 of the multiple pathways and the power output 14 and, likewise, introduces negligible signal loss for the circuit 10. Furthermore, the adder 24 may be identical to the splitter 16 but electrically connected in the reverse direction. In some embodiments, splitter 16 and adder 24 may be conventional elements.

Still referring to FIG. 1, a first amplifier 32 has its input connected to the first output 18 from the splitter 16. The output from the first amplifier 32 is then connected through two 60° phase shift components 34 which are connected in series from the output from the amplifier 32 and to the first input 26 of the adder 24. Alternatively, a single phase shift component of 120° may be substituted for the two series phase shift components 34.

A second amplifier 36 is connected in series with the second output 20 from the divider through a 60° phase shift component 38. The output from the second amplifier 36 is connected through a 60° phase shift component 40 to the second input 28 of the adder 24.

Lastly, a third amplifier 42 has its input connected through two 60° phase shift components 44 to the third output 22 from the splitter 16. The output from the third amplifier 42 is connected to the third input 30 of the adder 24.

Ideally, the three amplifiers 32, 36, and 42 are identical, or substantially identical, to each other so that all three amplifiers 32, 36, and 42 exhibit substantially identical signal reflection due to impedance mismatch at the input of each amplifier 32, 36, and 42. Additionally, the phase shift components 34, 38, 40, and 44 may take any construction, but preferably are in the form of a signal delay line.

Figure 2:
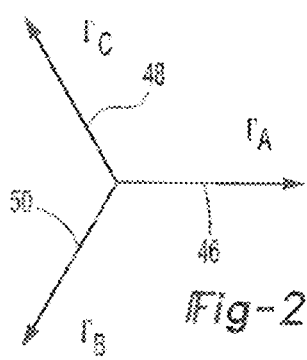
FIG. 2 is a vector diagram illustrating the reflected power at the input.

With reference now to FIGS. 1 and 2, in operation, the signal on the input 12 to the circuit is divided into three inputs 18, 20, and 22 of equal power and same phase to the multiple pathways. Due to the impedance mismatch at the first amplifier 32, a portion of the signal is reflected by the first amplifier 32 back to the input 12. This reflected signal is illustrated by vector 46 having a magnitude or length, and a phase shift of 0°, since it is taken as the reference signal.

The output from the first amplifier 32 is connected through the two 60° phase shift components 34 to the adder input 26. Consequently, the total phase shift from the input 18 and to the output 26 equals 120°.

Similarly, one third of the power at the input 12 flows through the phase delay component 38 to the input of the second amplifier 36. A portion of that power is reflected due to impedance mismatch back through the phase shift component 38 and to the input 12. This reflected power is illustrated in FIG. 2 as vector 48. The vector 48 has the same magnitude or length as the first vector 46 (assuming zero signal loss in the phase shift component 38) but is offset in phase by 120° due to the two signal passages through the 60° phase shift component 38.

The output from the second amplifier 36 is connected through a single 60° phase shift component 40 to the second input 28 of the combiner 24. Consequently, the overall phase shift from the input 20 and to the output 28 is equal to 120°, i.e. the same for the first amplifier 32.

Lastly, the signal from the third output 22 of the splitter 16 passes through the two 60° phase delay components 44 and to the input of the third amplifier 42. A portion of that signal is then reflected, due to impedance mismatch, back through the two phase shift components 44 to the input 12 so that the total phase shift for the reflected signal from the third amplifier 42 equals 240°.

The reflected image from the third amplifier 42 is illustrated in FIG. 2 as vector 50. The vector 50 has a magnitude of length the same, or at least substantially the same, as the vectors 46 and 48, but has a phase offset of 240° from the first vector 46. These three vectors 46, 48, and 50, however, when combined, effectively cancel each other both in magnitude as well as in phase. This, in turn, results in essentially zero, or extremely low loss for signal entering the input 12 to the three amplifiers in amplifier circuit 10.

In addition, the overall phase delay from the input 22, through the amplifier 42, and to the output 30 equals 120°, i.e. the same as the other amplifiers 32 and 36. As such, all three signals at the output 14 are in phase with each other at the output 14 for maximum signal strength. Furthermore, even in the event that the amplifiers 32, 36, and 42 introduce a phase delay of φ, the phase shift caused by each amplifier 32, 36, and 42 will be identical so that the signals at the output 14 from the adder 24 remain in phase with each other. By the same token, an introduction of a phase shift φ by the amplifiers 32, 36, and 42 would merely rotate the vector diagram illustrated in FIG. 2 by an angular amount equal to φ but would still result in cancellation of the vectors 46, 48, and 50.

The foregoing example of three amplifiers was by way of example only. Rather, any arbitrary numbers of at least three amplifiers, odd or even, may be used provided that the phase shift components are properly selected, for example, between the splitter and the adder, to produce reflected power signals from the amplifiers which cancel each other.

Figure 3:
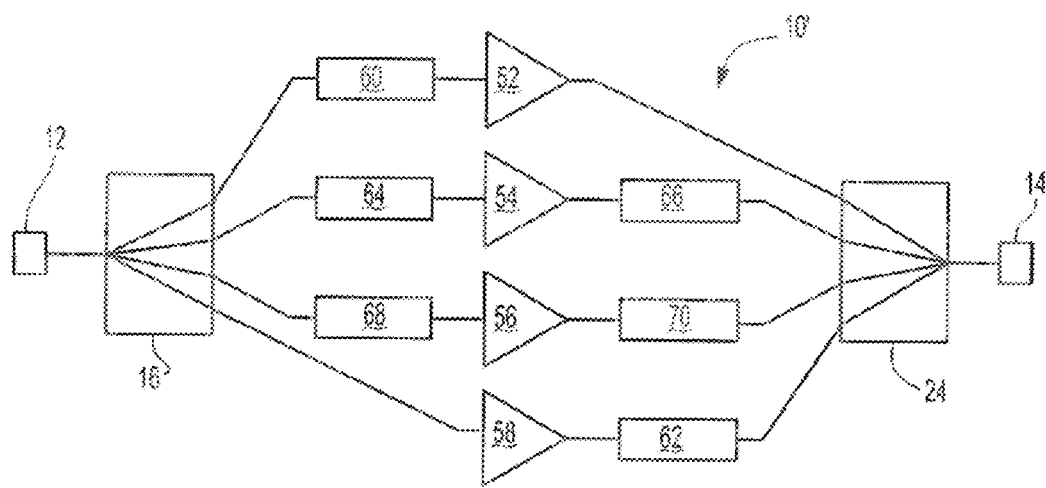
FIG. 3 is a view similar to FIG. 1, but illustrating a four amplifier circuit.

For example, with reference now to FIG. 3, a power amplifier circuit 10' having four amplifiers, namely a first amplifier 52, second amplifier 54, third amplifier 56, and fourth amplifier 58, is shown interconnected between an input 12 and output 14 of the power amplifier circuit 10'.

A 135° phase delay circuit 60 is connected between the input to the first amplifier 52 and the signal splitter 16 while the output from the first amplifier 52 is connected to the signal added 24. The opposite is true for the fourth amplifier 58, i.e. the input of the fourth amplifier 58 is connected to the splitter while its output is connected through a 135° phase shift component 62 to the adder 24.

A 90° phase shift component 64 is connected between the splitter 16 and the input of the second amplifier 54 while the output from the second amplifier 54 is connected through a 45° phase shift component 66 to the combiner 24. Lastly, a 45° phase shift component 68 is connected between the splitter 16 and input to the third amplifier 56 while the output from the third amplifier 56 is connected through a 90° phase shift component 70 to the adder 24.

Figure 4:
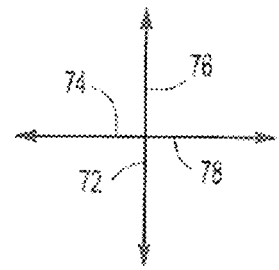
FIG. 4 is a view similar to FIG. 2, but illustrating the vector diagram for the circuit of FIG. 3.

Consequently, and with reference to FIGS. 3 and 4, a portion of the signal from the input 12 is reflected by the first amplifier 52 back to the input. That reflected signal passes through the 135° phase shift component 60 thus producing a total phase shift of 270° and a magnitude illustrated by the length of the vector 72 in FIG. 4. Similarly, a portion of the signal from the input 12 to the second amplifier 54 passes through the 90° phase shift component 64 twice thus resulting in a 180° phase shift illustrated at vector 74 in FIG. 4.

Similarly, a portion of the signal from the input is reflected by the third amplifier 56 twice through the 45° phase shift component 68 thus resulting in a 90° phase shift illustrated by vector 76 in FIG. 4. The signal reflected back to the input 12 by the fourth amplifier 58 has no phase shift and thus results in a vector 78 in FIG. 4 having a zero phase shift.

Ideally, the amplifiers 52, 54, 56, and 58 (or other electronic devices) are all identical to each other so that the magnitude of the reflected signal back to the input 12 is identical for each amplifier and represented by the length of each vector 72-78. The vectors 72-78 when added or combined together completely cancel out thus resulting in substantially zero power loss. Furthermore, the phase shift components 66, 70, and 62 which are connected between the amplifiers 54, 56, and 58 and the combiner 24 ensure that the total phase shift between the input 12 and output 14 for the power amplifier circuit 10' remains the same or, approximately, 135° plus any phase shift φ resulting from the amplifier itself.

In order to adjust the phase shift amount of the phase shift components for N electronic devices (e.g., amplifiers), the amount of phase shift for each sequential amplifier equals 1×(180°/N), 2×(180°/N), 3×(180°/N) . . . (N−1)×(180°/N). Or put another way, where the circuit includes N electronic devices and at least N−1 signal delay line components connected in series with the N electronic devices, power reflected from each electronic device to the input should exhibits a phase shift of π/N radians (=180/N degrees) or a multiples thereof with respect to other electronic devices. To achieve cancellation of the reflection vectors, they need to be evenly distributed around a theoretical circle of 360° or 2π radians in vector space as alluded to in FIG. 2 and FIG. 4. Hence, the proposed divider/combiner is called "π-wave" or "Pi-wave" divider and/or combiner.

Figure 5:
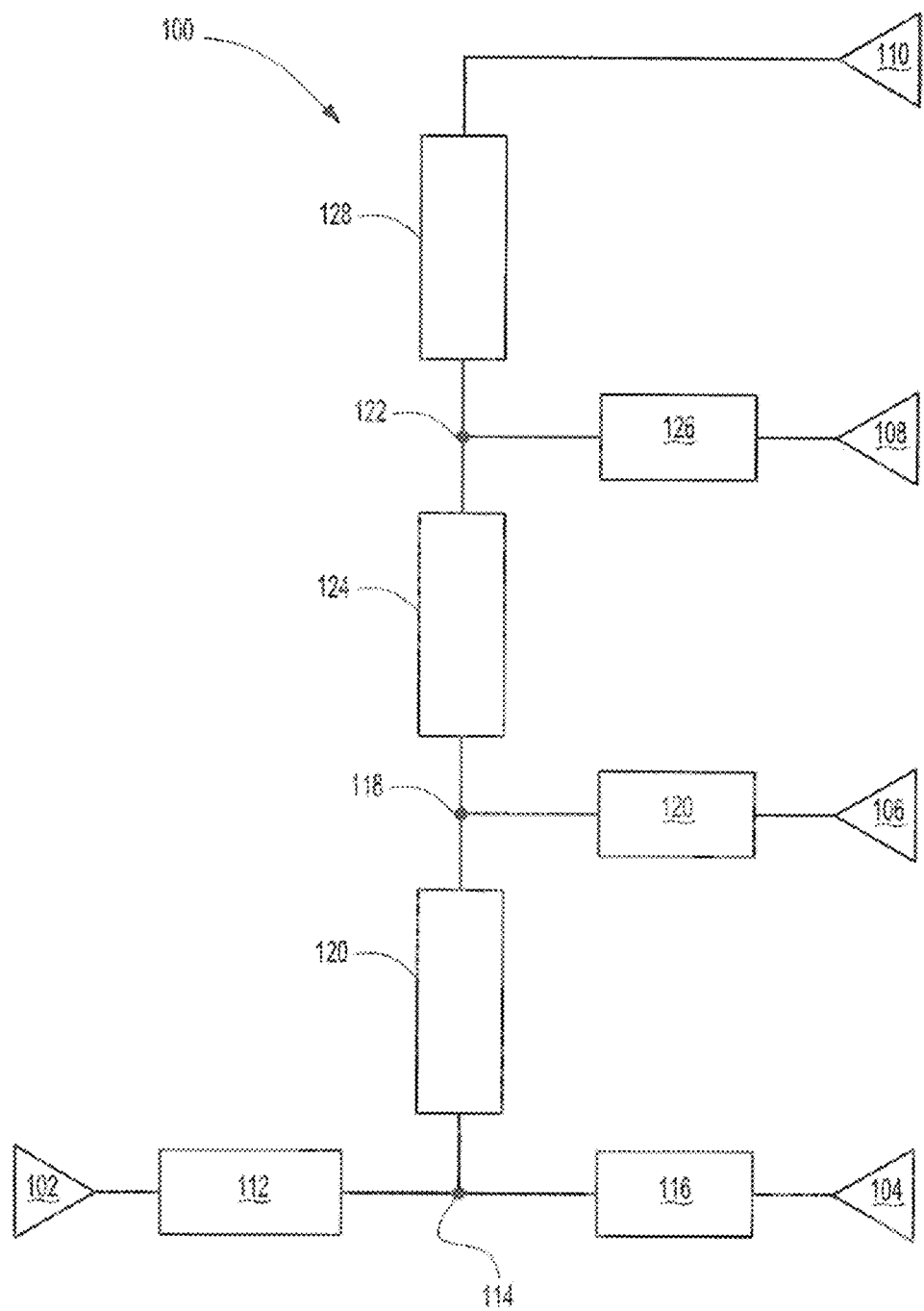
FIG. 5 is a block diagrammatic view of a circuit including a serial bus having serially connected impedance-providing components which increase in impedance from one end and to the other end according to another embodiment.

FIG. 5 is a block diagrammatic view of a π-wave divider circuit including a serial bus having serially connected impedance-providing components which increase in characteristic impedance values from one end and to the other end according to another embodiment. As will be appreciated, the serial bus having serially connected impedance-providing components is positioned between an input and a plurality of outputs in the when used for power-dividing (or in a reversed configuration when used for power-combining), the impedance-providing components increasing in impedance from one end and to the other end of the serial bus in an amount sufficient to produce a substantially equal amount of power to each of at least three electronic devices.

With reference now to FIG. 5, a circuit 100 is configured as a power-divider having one input and a plurality of outputs which provide a plurality of inputs to multiple electrical pathways depending from the serial bus. Here, the serial bus is illustrated for equally dividing a signal at its input 102 into four signals of equal power at its four outputs 104, 106, 108, and 110. The phase shift of the signal varies at each of the output ports 104-110. As will be described subsequently in greater detail, the circuit 100, when configured as a power-dividing circuit, a power-combining circuit or both, automatically corrects these phase shifts.

More specifically, an input signal at the input 102 first passes through a phase shift component 112 having a fixed phase shift, e.g. 90°, and a fixed characteristic impedance, e.g. 25 ohms, to a common node 114. Power from the common node 114 then provides power to all four outputs 104, 106, 108, and 110. The outputs 104, 106, 108, and 110 may subsequently provide inputs to electrical pathways having electronic devices, such as amplifiers, as further illustrated in FIG. 6.

In particular, the node 114 is electrically connected to the first output 104 by an impedance component 116 having a zero phase shift and a fixed impedance of 50 ohms. The node 114 is then connected to a node 118 by a phase shift component 120 having a fixed phase shift of 45° and an impedance of 16.6 ohms. Since the characteristic impedance of the phase shift component 120 is one third of the characteristic impedance of the phase shift component 116, one quarter of the power from the node 114 flows to the first outlet 104 while three quarters of the power from the node 114 flows to the node 118.

The node 118 is connected by an impedance component 120 having impedance of 50 ohms and a zero phase shift to the second output 106. The node 118 is also connected to a node 122 by a phase shift component 124 having a phase shift of 45° and an impedance of 25 ohms. Since the impedance of the phase shift component 124 is one half the impedance of the impedance component 120, one third of the power from the node 118 passes to the output 106 while two thirds of the power passes through the phase shift component 124 to the node 122.

The node 122 is connected to the third outlet 108 through an impedance component 126 having an impedance of 50 ohms and a zero phase shift. The node 122 is also connected to the first outlet 110 by a phase shift component 128 having a phase shift of 45° and an impedance of 50 ohms. Since the phase shift component 128 has the same impedance as the impedance component 126, the power at node 122 is evenly divided between the third outlet 108 and fourth outlet 110.

Figure 6:
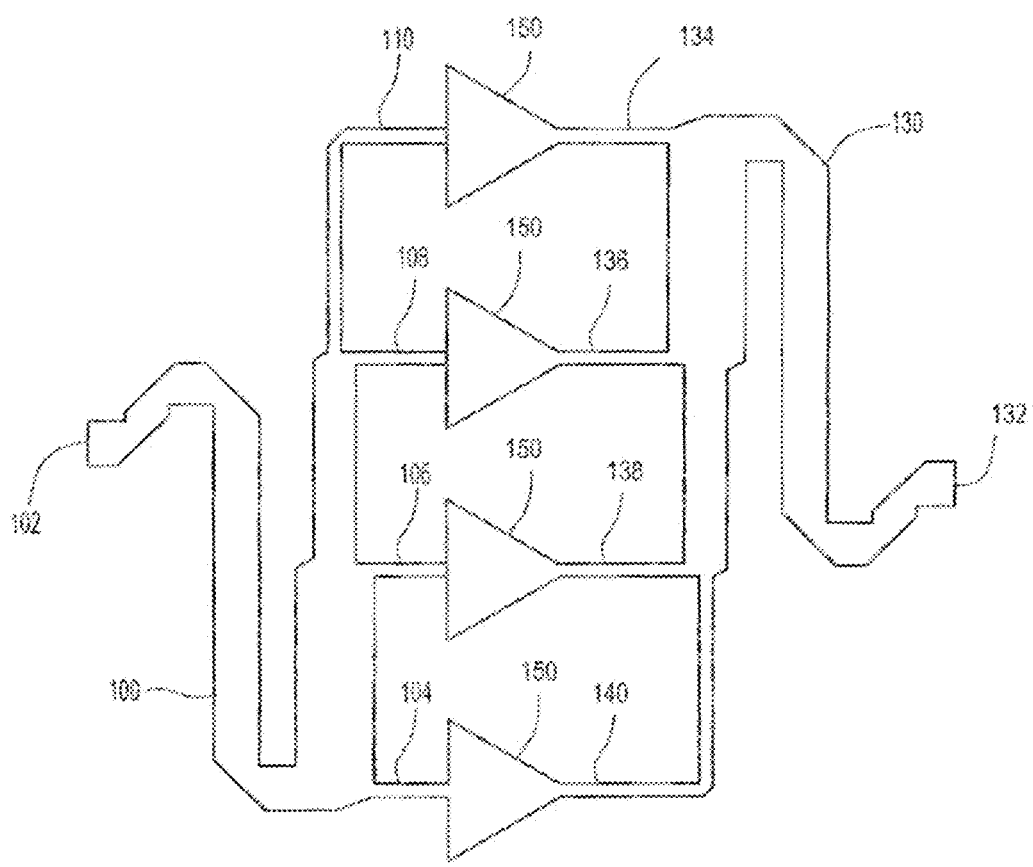
FIG. 6 is a view of a power amplifier system using the circuit illustrated in FIG. 5.

Consequently, it can be seen that the serial bus 100 evenly distributes power from its input 102 to its four outputs 104, 106, 108, and 110. However, as described below, the signals at the divider outputs are phase shifted relative to each other. With reference now to FIG. 6, a circuit is illustrated which is configured as a divider/combiner. Here, the circuit 100 of FIG. 5 is shown as a signal divider 100 for the power-dividing portion of the circuit having an input 102, and also as a signal combiner 130 for the power-combining portion of the circuit having an output 132. The circuit illustrated in FIG. 6 is thus configured as a divider/combiner having one input 102 and one output 132. A first serial bus 100 generates inputs to the multiple pathways from the one input 102, and a second serial bus 130 generates the one output 132 from outputs from the multiple paths. In this configuration, the total signal phase shift between the multiple paths as measured at the one input and the one output is substantially equal to zero.

Figure 7:
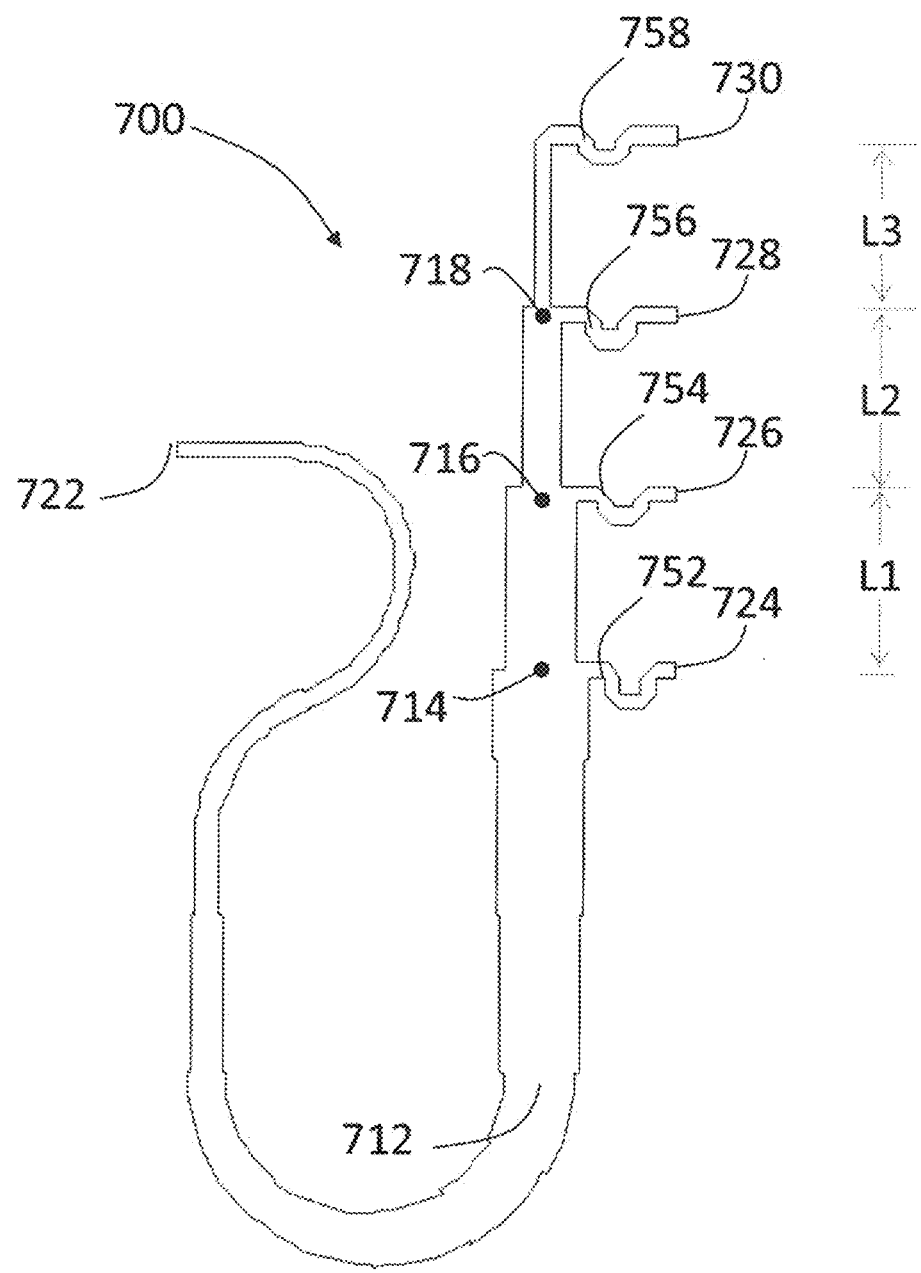
FIG. 7 is a 1-to-4 π-wave (or Pi-wave) divider with a broadband Klopfenstein taper matching according to another embodiment.

FIG. 7 shows a π-wave circuit 700 configured as a power-divider according to an embodiment having one input 722 and four outputs 724, 726, 728 and 730 (i.e., N=4). The circuit may be used to equally divide a signal at the input 722 into four signals of equal power at its four outputs 724, 726, 728 and 730. In some implementations, the circuit 700 may be used as a power bus for supplying power from the output to other elements, such as amplifiers. Of course, it will be appreciated that the circuit 700 can be operated backwards as a power-combiner in other embodiments, with four inputs 724, 726, 728 and 730 and one output 722. In this circuit, the phase shift components are a common transmission line.

The 1-to-4 π-wave divider 700 has a broadband Klopfenstein taper 712. A Klopfenstein taper is a device in which the characteristic impedance varies along its length and provides minimal reflection for the input port. Other tapered impedance matching devices might alternatively be used such as triangular, exponential, etc.

Each of the outputs 724, 726, 728, and 730 may include a corresponding meander line 752, 754, 756, and 758. The meander line is a transmission line which may be added to each output to further adjust the phase of each output. The phase shift of the signal varies at each of the outputs. The circuit 700 is designed to correct for these phase shifts. Here, the meander line and the transmission line to each of the corresponding outputs affect the phase delays to a given output. In general, phase delay of each of these elements relates to its length, with the delay increasing as the length increases. Thus, the meander line lengths and the transmission line lengths L1, L2, and L3 are chosen such that the total delay from point 714 to 726 is 180/4 degrees or π/4 radians more than the reference (where the reference is taken as the delay from 714 to 724), the delay from point 714 to 728 is 2(180/4) degrees or 2(π/4) radians more than the reference, the delay from point 714 to 730 is 3(180/4) degrees or 3(π/4) radians more than the reference.

The circuit 700 is further designed so as to adjust the impedance at different portions of the transmission line pathway to ensure that power is equally split between the outputs. The default impedance level of a typical system connected to the input 722 may be assumed to have an impedance of about 50 ohms. Indeed, many microwave systems are assumed to have 50-ohms impedance; for waveguide structure, it would be several hundred ohms dependent on the waveguide size. It should be appreciated that this value is not limiting and is used for exemplary purposes here.

At point 714, one fourth of the power is split from the transmission line to output 724, with three-fourths of the power continuing through 716, 718 towards outputs 726, 728 and 730. Thus, the characteristic impedance should be 50/4-ohms at point 714. The characteristic impedance from 714 to 716 is 50/3 ohms, and from 714 to 724 is 50 ohms.

Similarly, the characteristic impedance from 716 to 718 is 50/2-ohms, and from 716 to 726 is 50 ohms. This ensures that a third of the power will be split to output 726 with two-thirds of remaining signal power continuing to outputs 728, 730. And, the characteristic impedance at point 718 is 50/2-ohms to ensure the remaining power in the transmission line is equally split between outputs 728 and 730. To these ends, the width of the transmission line is narrowed in discrete steps, beginning at points 714, 716 and 718. As it narrows, the characteristic impedance of the transmission line increases. The Klopfenstein taper 712 is configured to match the impedance from 50/4 to 50-ohms, the default impedance level of the system.

While circuit 700 is configured for an even number of output (four here), it will be appreciated that an odd number of outputs can similarly be provided. Implementations with even division (e.g., N=2, 4, 6 . . . ) and with odd division (e.g., N=3, 5, 7 . . . ) show the versatility of this approach. The ability to provide arbitrary (odd and even, especially odd) N-divisions for equal output signals is not easily available in many other conventional divider approaches. For example, a Wilkinson divider can provide 1-to-2 division. However, a 1-to-3 Wilkinson divider results in non-planar resistors; hence, it is difficult to implement using standard planar circuit techniques. Additionally, a Lange divider can provide 1-to-2 divisions. However, they cannot provide 1-to-3 divisions.

In other embodiments, isolation circuits or devices can be inserted between pairs of signal lines to provide isolation between various inputs or outputs. The additional isolation provided can advantageously benefit the power dividing and power combining circuits as further explained.

Figure 8:
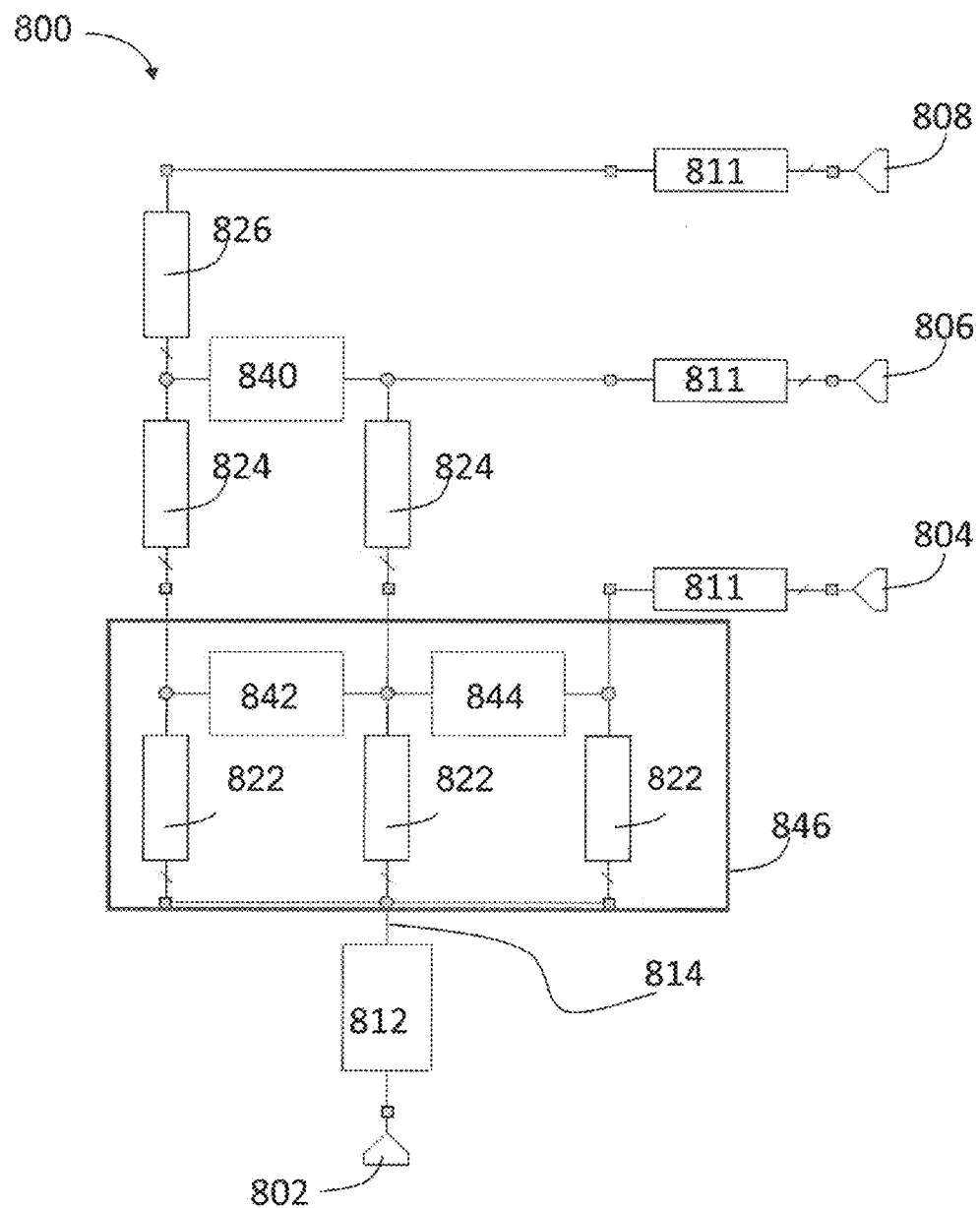
FIG. 8 is a block diagram of a π-wave divider circuit embodying the 1-to-3 π-wave divider with isolation according to an embodiment.
Figure 9:
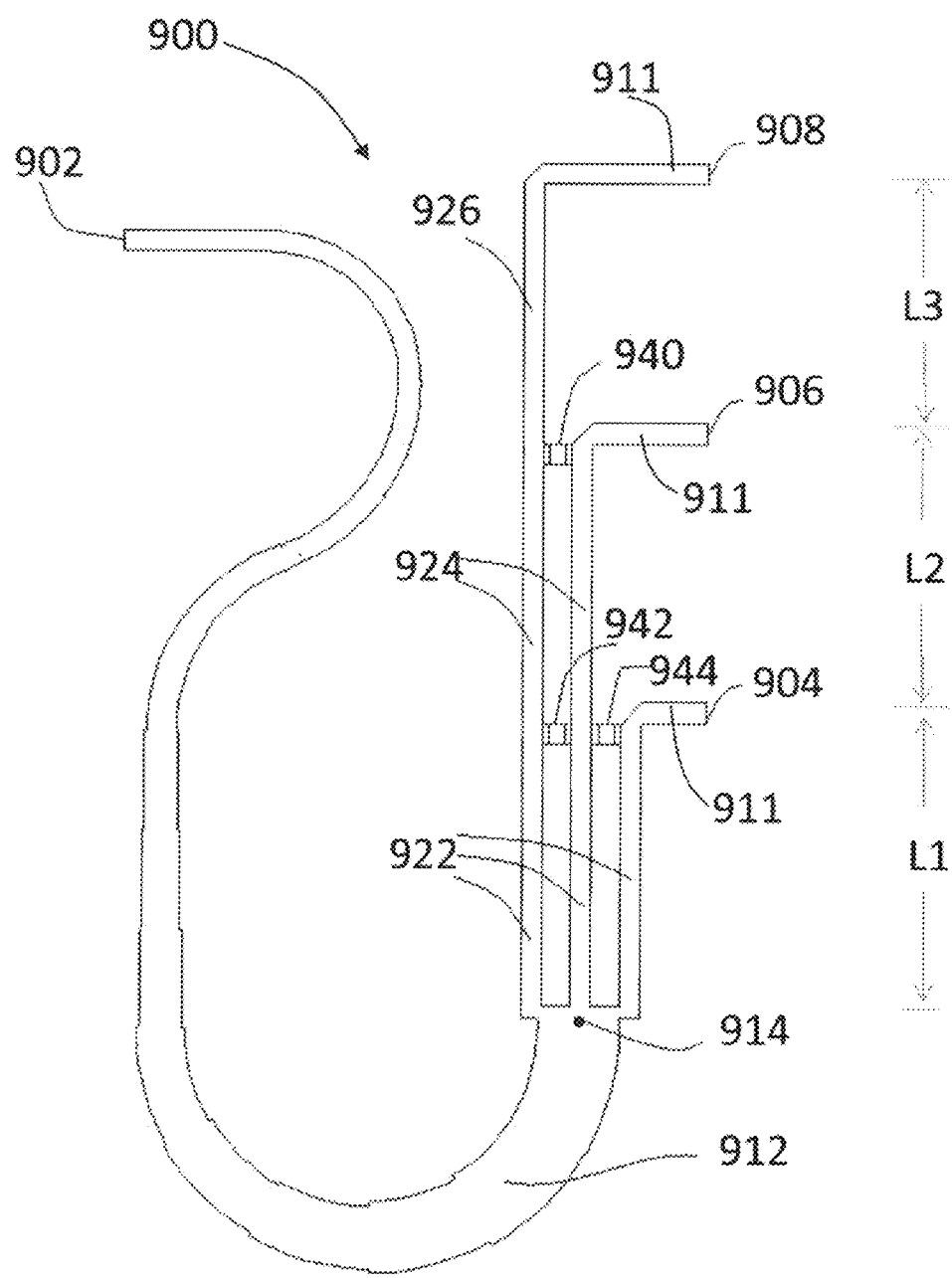
FIG. 9 shows a 1-to-3 π-wave divider circuit with isolation according to an embodiment.
Figure 9A:
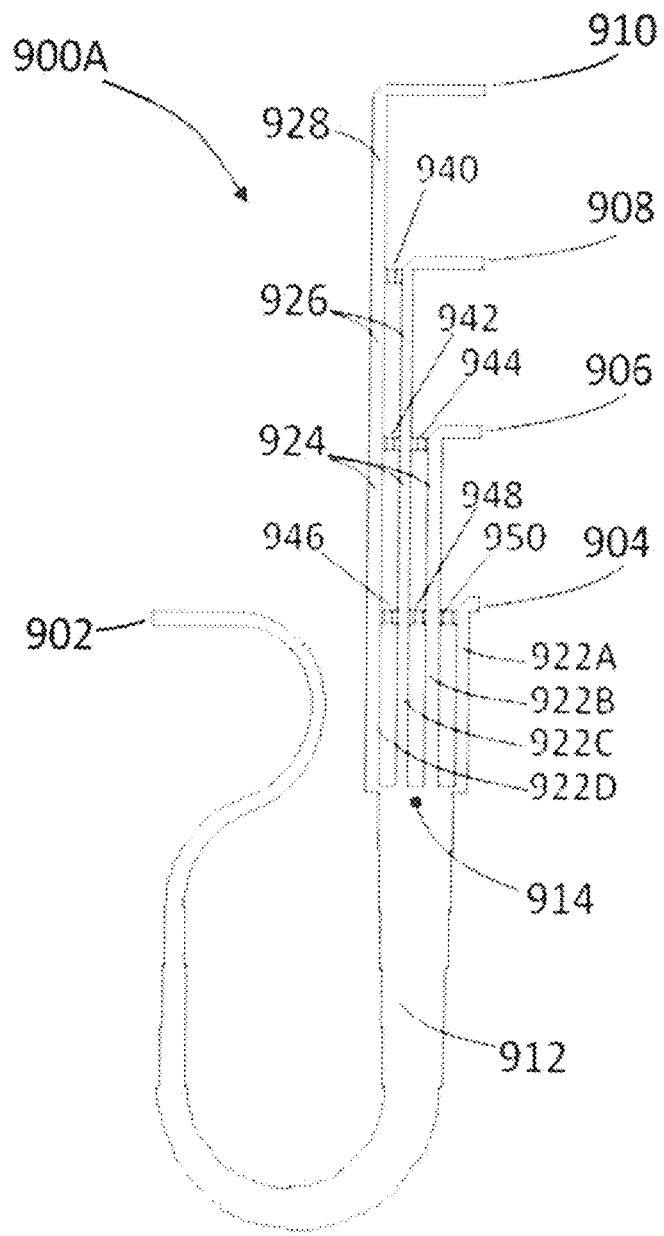
FIG. 9A shows and a 1-to-4 π-wave divider circuit with isolation according to an embodiment.

FIG. 8 is a block diagrammatic view of a π-wave circuit 800 configured as a divider, 800, which provides increased isolation among the outputs according to an embodiment. FIG. 9 shows exemplary π-wave circuit for the divider illustrated in FIG. 8, which was designed for a 2 GHz (for example) centered frequency. FIG. 9A shows exemplary π-wave circuit for the divider illustrated in FIG. 8, having 1-to-4 division. It was designed to have a 2 GHz centered frequency.

Referring to FIG. 8, a 1-to-3 π-wave divider circuit 800, an input 802 and three outputs 804, 806, and 808. Each output is connected to an extension transmission line 811 which connects it to the divider. It will be appreciated that circuit 800 can be designed for additional (odd or even number of) outputs.

It is highly desirable for power dividers to have isolation between various outputs. Isolation between the outputs is defined as the ratio of power that exits one output port, call it x, when power is inserted in another output port, call it y, while having all other ports (other than x, and y) terminated in $Z_o$, the characteristic impedance. Referring to FIG. 8, the isolation between ports 804 and 806 is defined as |S(804, 806)| where S(x,y) is defined as the scattering parameter between ports x, and y. The scattering parameter S(804,806), for example, is measured by terminating all ports in FIG. 8 with $Z_o$, and then exciting port 806 with an incident wave and measuring the output power exiting port 804. In most cases, it is desirable to have all isolation quantities (i.e. |S(804,806)|, |S(804,808)|, and |S(806,808)|) as small as possible; such that |10 log(|S(804,806)|)|, |10 log(|S(804,808)|)|, and |10 log(|S (806,808)|)| is as large as possible (so that maximum isolation can be achieved). When a divider exhibits high isolation between the outputs, the devices (e.g. semiconductor devices, amplifiers, or phased-array elements connected to the divider) that are fed by the divider have very little interaction (or cross-talk). Hence, each device (or amplifier) sees a good (=$Z_o$) fixed impedance even if the other devices (or amplifiers) have poor (≠$Z_o$) input/output impedances. This is important because many active devices (e.g. amplifiers) tend to oscillate or produce poor performance when the input/output impedance deviates from $Z_o$. Having a divider with isolation ensures that devices are isolated from one another and cannot influence each other. It will be appreciated that a divider with isolation can also be used as a high-isolation combiner with inputs and outputs being reversed. The power divider/combiner can be used in the frequency range of 0.1-1,000 GHz, for instance.

At point 814, the circuit splits into three separate parallel pathways to the outputs 804, 806, and 808, respectively. The phase shift of the signal varies at each of the outputs because of differing distances from point 814. Thus, the circuit 800 includes multiple phase shifting elements 822, 824 and 826 to correct for these phase shifts. To these ends, there is provided a single phase shifting element 822 between point 814 and the output 804. Additionally, there are phase shifting elements 822, 824 positioned between point 814 and the output 806, and phase shifting elements 822, 824, 826 between point 814 and output 808.

The phase shifting elements 822, 824 and 826 are typically transmission lines with characteristic impedance of about 50-ohms, the default impedance level of the system.

The phase shifting elements 822, 824 and 826 have typical phase delays equal to 180/N degrees, where N is the division ratio, assuming they are of equal length. In this case, for a 1-to-3 divider, N=3. Thus, phase shifting elements with 180/3 degrees or π/3 radians phase shift are chosen so that the vector reflection coefficients (from outputs 804, 806, and 808, which are intended to be substantially equal in magnitude and phase) cancel each other at point 814. The phase delay is related to the signal distance. As such, the pathway from point 814 to output 804 requires only 180/3 degrees or π/3 radians phase delay provided by phase shifting element 822. The pathway from point 814 to output 806 requires require a phase delay of 2(180/3) degrees or 2(π/3) radians provided by phase shifting elements 822, 824 together. And the pathway from point 814 to output 808 requires a phase delay of 3(180/3) degrees or 3(π/3) radians provided by phase shifting elements 822, 824, 826 together.

The phase shifting elements, 822, 824 and 826, may also be implemented using a combination of distributed elements, such as transmission lines, and lumped components, such as resistors, inductors, capacitors and transistors in discrete form or in integrated circuit form, such as MA-COM® 4-bit digital phase shifter part number MAPS-010146, for instance. ICs of this type may include a plurality of switchable delay lines in series such that they can be switched in order to provide a desired phase delay of up to 360 degree in discrete steps, such as 22.5 degrees per step, for example.

The circuit 800 is further designed to ensure power is equally split between the outputs 804, 806, and 808. The input 802 may be assumed to have an impedance of about 50 ohms, the default impedance level of the system. Since there is a separate pathway from point 814 to each of the three outputs 804, 806, 808, the impedance level at point 814 to is about 50/3-ohms to ensure that one-third of the power is provided to each of these outputs. A broadband matching network 812 matches the impedance from 50/3 to 50-ohms, the default impedance level of the system; for waveguide structures, the default impedance would be several hundred ohms.

There are many options for implementing matching network 812 including lumped matching networks, multi-section transmission lines, and tapered transmission lines (such a Klopfenstein taper which gives broadband matching between two real impedances).

The transmission lines 822, along with circuits or devices 842, and 844, form a 1-to-3 isolation network 846 that splits an input signal at 814 into three outputs that are isolated. The design of lines 822, and circuits or devices 842 and 844 aims to optimize, and in some cases, maximize the isolation between the output signals. Additionally, the circuit 840 is chosen to maximize the isolation between the outputs 804, 806, and 808.

FIG. 9 shows one exemplary π-wave circuit 900 of the divider 800 illustrated in FIG. 8. Circuit 900 here is configured as a 1-to-3 π-wave divider where there is provided an input 902 and three outputs 904, 906, and 908. In this circuit, the phase shift components are transmission lines. The phase delay to each output is related to the signal distance, with the delay increasing with length of the transmission lines.

The delay lines 922 have phase delays equal to π/N, where N is the division ratio. Again, in this case, for a 1-to-3 divider, N=3. A phase delay of 180/3 degrees or π/3 radians is chosen for this element so that the vector reflection coefficients (from 904, 906, and 908, which are intended to be substantially equal in magnitude and phase) cancel each other at point 914. The lengths of delay lines 924, and 926 can be similarly selected to ensure the reflection coefficients to the remaining outputs 906 and 908 are further cancelled each other out at point 914. L1, L2 and L3 represent the physical lengths corresponding to delay lines 922, 924, and 926, respectively.

Each output is also connected to an extension transmission line 911 which connects it to the divider. The extension transmission line 911 for each output may also have a different length. But the phase delays of the transmission line 911 should be selected to ensure that reflections (from 904, 906, and 908) cancel at point 914.

Turning now to impedance, it may be assumed that the default impedance level of the system of about 50-ohms. Thus, the impedance level at point 914 is about 50/3-ohms to split power between the three outputs. A broadband Klopfenstein taper matching network 912 is provided which is configured to match the impedance from 50/3 to 50-ohms, the default impedance level of the system.

Isolation circuits or devices 940, 942, and 944 are resistors here chosen to increase the isolation among the outputs 904, 906, and 908. Exemplary values for resistors are 50-300 ohm (for 940), 0-100 ohm (for 942), and 30-300 (for 944). The resistor values that provide optimum, or in some cases, maximum isolation among the outputs can be obtained using optimization techniques available in standard simulation tools (e.g. Microwave Office® from Associate Wave Research, or Advanced Design System® from Keysight Technologies). The optimization typically leads to resistor values that have an order of magnitude (within 0.1 to 10) similar to $Z_o$ the characteristic impedance of the system; typically about 50-ohms. In some embodiments, the isolation circuits or devices 940, 942, and 944 may be more sophisticated networks (such as composed of resistors, inductors, capacitors, transistors, and transmission lines) than merely providing simple resistors. If one implements the isolation circuits or devices in a waveguide system, for example, instead of using resistors to provide signal isolation, one could use EM absorbing material, which has similar function, except in waveguide mode the term EM propagation is used. More sophisticated isolation circuits improve isolation at the cost of higher complexity, and larger size. One skilled in the art will recognize and appreciate that in designing a power-dividing or power-combining for a particular application there are certain tradeoffs in terms of complexity and performance.

FIG. 9A shows another exemplary circuit 900A of the divider 800 illustrated in FIG. 8, which shows a block diagram thereof. Circuit 900A is configured as a 1-to-4 divider with isolation resistors. For a 1-to-4 divider, N=4. There is an input 902 and four outputs 904, 906, 908 and 910. As shown, the isolation circuits or devices 940, 942, 944, 946, 948, 950 may be resistors. These resistors may be between 0-1,000 ohms, about the same order of magnitude as 50-ohms, the default impedance of the system; for waveguide structures, the default impedance would be several hundred ohms. Optimization techniques available in standard simulation tools can be used to determine more optimum values, as discussed above.

In general, the circuit 900A and circuit 900 are similar except for the phase shifts and impedance. For instance, the phase shifts for circuits 900A are made to be 180/4 degrees, instead of 180/3 degrees. And, assuming that the default impedance level of the system of about 50-ohms, the impedance level at point 914 is about 50/4-ohms to split power between the four outputs, instead of 50/3-ohms for splitting power between three outputs. A broadband Klopfenstein taper matching network 912 is provided which is configured to match the impedance from 50/4 to 50-ohms, the default impedance level of the system.

Figure 10:
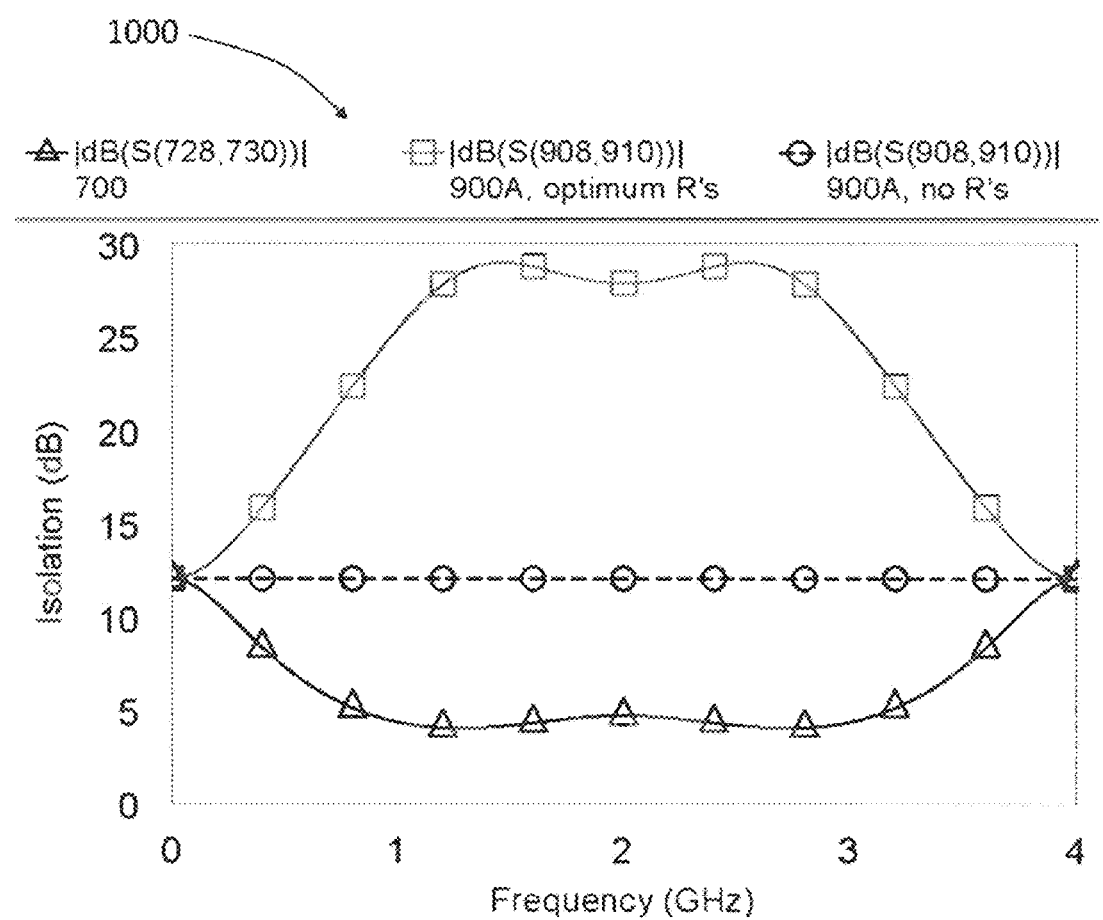
FIG. 10 shows is a plot showing the isolation between specified output ports, the other output ports terminated with impedance matched loads for dividers illustrated in FIG. 9A and FIG. 7.

FIG. 10 shows is a plot showing the isolation between output ports for dividers illustrated in FIG. 9A and FIG. 7 for comparison sake. The isolation between output ports 908 and 910 (from FIG. 9A) is defined here as |10 log(|S(910,908)|)|. Additionally, the isolation between output ports 728 and 730 (from FIG. 7) is defined as |10 log(|S(730,728)|)|.

For the structure in FIG. 9A, two cases are shown. In one case, the isolation resistors are optimized, and in the other case, they are set of infinity (i.e. there are no resistors). The plot in FIG. 10 shows both cases.

For the former, optimized case in FIG. 10, the resistor values chosen were 300, 130, 60, 0, 0, and 25 ohm for isolation resistors (in FIG. 9A) 940, 942, 944, 946, 948, and 950, respectively. Generally, it is desirable to maximize isolation between all ports (i.e., between 904/906, 904/908, 904/910, 906/908, 906/910, and 908/910). A wide range of values for the resistors can be used in FIG. 9A with each choice producing varying degrees of isolation performance. As can be seen, there is up to 20 dB of improvement in isolation between divider 900A (with optimum isolation resistors) and divider 700. In the latter case, it may still be desirable to reduce (or eliminate) the use of isolation resistors (e.g. for cost considerations). Even in this case, there is about 8 dB of improvement in the isolation between 900A (with no resistors) and divider 700.

It should be appreciated though that the power-dividing and power-combining portions of the circuit may similarly function as stand-alone circuits in other embodiments. Referring back to FIG. 6, for instance, a power-dividing circuit may have one input and a plurality of outputs, where the serial bus 100 generates inputs to the pathways from the one input 102, with outputs from the pathways providing the plurality of outputs. And a power-combing circuit may have a plurality of inputs and one output 132, where the serial bus 130 generates the one output 132 from outputs of the pathways, with inputs to the pathways providing the plurality of the inputs.

When the serial bus is employed as a combiner 130, the inputs 104, 106, 108, and 110 illustrated in FIG. 5 now act as signal outputs 134, 136, 138, and 140, respectively. It is noted that the combiner 130 may be thought of as being oriented "upside-down" with respect to the divider 100 in FIG. 6 so as to be function in a reversed manner. Four power amplifiers 150 are located along the four electrical pathways between the divider 100 and combiner 130 so that one power amplifier 150 is electrically connected between the divider output 110 and the combiner input 134 while one amplifier 150 is connected between the divider output 108 and the combiner input 136. Similarly, one amplifier 150 is electrically connected between the divider output 106 and the combiner input 138 while one amplifier 150 is electrically connected between the divider output 104 and the combiner input 140. Ideally, all four amplifiers 150 are identical in operation to each other.

With reference now to both FIGS. 5 and 6, the phase shift of a reflection from the amplifier 150 at the node 114 from the divider output 104 will equal a zero phase shift and thus result in the vector 78 illustrated in FIG. 4. Each impedance-providing component may be configured to create a phase shift equal to 180°/N or a multiple thereof, where N equals the number of electronic devices.

The power that is reflected by the amplifier 150 through the second divider output 106 passes twice through the phase shift component 120 (FIG. 5) thus resulting in an overall phase shift of 90° corresponding to vector 76 in FIG. 4. Similarly, the reflected power from the amplifier 150 from the third divider output 108 passes through the phase shift components 120 and 124 twice, thus, resulting in an overall phase shift of 180° as shown by vector 74. Similarly, a reflected signal from the power amplifier 150 through the output 110 passes twice through the phase shift components 120, 124, and 128 thus resulting in an overall phase shift of 270° which corresponds to vector 72 in FIG. 4. As before, the vectors 72-78 all cancel each other thus minimizing or eliminating signal reflection from all amplifier at the input 102 with minimal signal power loss input into the amplifiers 150.

In addition to an equal distribution of power by the divider 100, the total phase shift from node 114 (FIG. 5) in the divider 100 to the corresponding node in the combiner 130 is identical for each amplifier path and is equal to 135° plus any phase shift caused by the amplifiers 150. For example, the signal passing from node 114 in the divider 100 through the first output 104 must pass through all three phase shift components 128, 124, and 120 (FIG. 5 when employed as a combiner) in the combiner 130 thus resulting in a total phase shift of 135°.

Phase shift components and components with different impedances have been described for controlling the power distribution and phase shift of the various circuits described herein. In some instances, for example, the phase shift components and/or impedance-providing components may be transmissions lines having a predetermined length, having a characteristic impedance and a predetermined length. Examples of transmission lines may include microstrip lines, striplines, co-planar waveguides, or waveguides. The magnitude and/or phase of the transmission lines may be judiciously selected to provide desired electrical characteristics. For instance, the electronic length of the transmission lines may dictate the phase shift (or delay) of the signal.

For a microstrip line or stripline configuration, the line may have a conductor on top of a ground plane with a dielectric there between. The longer in length of the line the greater delay may be achieved. For a given thickness of the dielectric, the characteristic impedance can be changed by changing the width of the top conductor from a relative base-line (e.g., which may be 50 ohm characteristic impedance). If the conductor is made narrower, the characteristic impedance is increased. Whereas if the conductor is made wider, the characteristic impedance is decreased. And the magnitude of the signal may be dictated by changing the impedance of the transmission line to be different from the input impedance. For a waveguide configuration, the waveguide may be a conventional waveguide (e.g., a standard waveguide size) or a modified/custom form to achieve different wave impedance thereof. And, for a co-planar waveguide (CPW) configuration, the structure may a conventional CPW, and/or modified/custom form thereof which includes spacing of different conductors supporting wave propagation located on the same plane on top of a dielectric substrate. The median strip is the signal line and the two surrounding strips serve as grounds. For a waveguide or CPW, changing the dimensions thereof generally changes the characteristic impedance and phase shift as one skilled in the art appreciates. However, it should be appreciated that other phase shifting and impedance-providing means may be used without deviating from the spirit or scope of the invention.

The power dividing/combining techniques described can be implemented using a variety of fabrication techniques including printed circuit boards (PCB), and integrated circuit (IC) techniques.

The power-dividing and/or power-combining circuit embodiments described herein may be applicable for RF-to-submillimeter-wave signals, when used in power amplifier configuration demonstrated minimum reflected signal at the input or output. The technique combines and cancels reflections of multiple (any number) amplifiers. The technique also eliminates the need for expensive, bulky and RF-lossy isolators required at the input/output of conventional power amplifiers, thus reducing system costs.

From the foregoing, it can be seen that the present invention provides a novel power amplifier circuit, as well as an improved divider/combiner for microwave/millimeter-wave circuitry or microwave systems. Having described our invention, however, many modifications thereto will become apparent to those skilled in the art to which it pertains without deviation from the spirit of the invention as defined by the scope of the appended claims.

We claim:

1. A power-dividing and/or power-combining circuit comprising:
   one or more inputs;
   one or more outputs;
   at least three electrical pathways, said pathways having substantially equal signal reflection between said one or more inputs and said one or more outputs;
   a plurality of phase shift components, at least one phase shift component electrically in each of the electrical pathways, said phase shift components being selected so that a vector sum of the reflected signals from said one or more inputs and/or to said one or more outputs is substantially minimized; and
   one or more isolation circuits or devices positioned between at least one input or at least one output and at least one pathway.

2. The circuit as defined in claim 1, wherein the one or more isolation circuits or devices comprise a resistor, inductor, capacitor, transistor, transmission line, or any combination thereof, or electromagnetic absorbing material.

3. The circuit as defined in claim 2, wherein the one or more isolation circuits or devices are selected to be on the order of magnitude of the characteristic impedance of a system connected to the circuit.

4. The circuit as defined in claim 2, wherein the one or more isolation circuits or devices comprise a resistor.

5. The circuit as defined in claim 4, wherein the resistor ranges from about 0 to 1,000 ohms.

6. The circuit as defined in claim 1, wherein at least one isolation circuit or device is positioned between two pathways, with one pathway going to one input or output and the other pathways going to another input or output.

7. The circuit as defined in claim 6, wherein the two pathways are parallel to one another.

8. The circuit as defined in claim 1, wherein the one or more isolation circuits or devices are positioned at approximately 180/N degrees integrals of electric length of a pathway.

9. The circuit as defined in claim 1, being configured as:
   (i) a divider having one input and a plurality of outputs, and a splitter generating inputs to the pathways from the one input, with outputs from the pathways providing the plurality of outputs;
   (ii) a combiner having a plurality of inputs and one output, and an adder generating the one output from outputs from the pathways, with inputs to the pathways providing the plurality of inputs; or
   (iii) a divider/combiner having one input and one output, a splitter generating inputs to the pathways from the one input, and an adder generating the one output from outputs from the pathways.

10. The circuit as defines in claim 9, wherein when configured as (iii) the power divider/combiner the total signal phase difference between the multiple paths as measured between the one input and the one output is substantially equal to zero.

11. The circuit as defined in claim 1, further comprising: at least one electronic device provided in each of the electrical pathways.

12. The circuit as defined in claim 11, wherein said electronic devices comprise: amplifiers, switches, attenuators, mixers, filters, antenna elements, or any combination thereof.

13. The circuit as defined in claim 1, wherein said phase shift component comprises a signal delay line, phase delay network or an integrated circuit (IC) phase shifter device.

14. The circuit as defined in claim 1, wherein said circuit includes N electronic devices and at least N−1 signal delay line components connected in series with N electronic devices so that power reflected from each electronic device to said input exhibits a phase shift of 180/N degrees or a multiples thereof with respect to two other electronic devices.

15. The circuit as defined in claim 1, wherein the phase shift components are transmissions lines having a predetermined length.

16. The circuit as defined in claim 15, wherein the transmission lines are microstrip lines, striplines, co-planar waveguides, or waveguides.

17. The circuit as defined in claim 1, wherein said circuit is configured as an MMIC.

18. A power-dividing and/or power-combining circuit comprising:
   one or more inputs;
   one or more outputs;
   at least three electrical pathways;
   at least three electronic devices with substantially equal signal reflection between said one or more inputs and said one or more outputs, at least one of said electronic devices in each of the electrical pathways;
   a serial bus extending from said one or more inputs and said one or more outputs, said serial bus having serially-connected impedance-providing components positioned between said electrical pathways, said impedance-providing components increasing in impedance from one end and to the other end of said serial bus in an amount sufficient to produce a substantially equal amount of power to each of at least three electronic devices and to produce substantially minimized reflection at the one or more inputs and the one or more outputs; and
   one or more isolation circuits or devices positioned between at least one input or at least one output and at least one pathway.

19. The circuit as defined in claim 18, being configured as:
   (i) a divider having one input and a plurality of outputs, wherein the serial bus generates inputs to the pathways from the one input, with outputs from the pathways providing the plurality of outputs;
   (ii) a combiner having a plurality of inputs and one output, wherein the serial bus generates the one output from outputs of the pathways, with inputs to the pathways providing the plurality of the inputs; or
   (iii) a divider/combiner having one input and one output, wherein a first of said serial bus generates inputs to the multiple pathways from the one input, and a second of said serial bus generates the one output from outputs from the multiple paths.

20. The circuit as defines in claim 18, wherein when configured as (iii) the combiner/divider, the total signal phase shift between the multiple paths as measured at the one input and the one output is substantially equal to zero.

* * * * *